United States Patent [19]

Harris et al.

[11] Patent Number: 5,851,908

[45] Date of Patent: Dec. 22, 1998

[54] METHOD FOR INTRODUCTION OF AN IMPURITY DOPANT IN SIC, A SEMICONDUCTOR DEVICE FORMED BY THE METHOD AND A USE OF HIGHLY DOPED AMORPHOUS LAYER AS A SOURCE FOR DOPANT DIFFUSION INTO SIC

[75] Inventors: Christopher Harris, Sollentuna; Andrei Konstantinov, Linköping; Erik Janzén, borensberg, all of Sweden

[73] Assignee: ABB Research Ltd., Zurich, Switzerland

[21] Appl. No.: 436,488

[22] Filed: May 8, 1995

[30] Foreign Application Priority Data

Apr. 10, 1995 [SE] Sweden .................................. 9501310

[51] Int. Cl.$^6$ .................................................. H01L 21/265
[52] U.S. Cl. .......................................... 438/520; 438/931
[58] Field of Search .............................. 437/22, 24, 141, 437/143, 160; 148/DIG. 148; 438/520, 931

[56] References Cited

U.S. PATENT DOCUMENTS

| | | | |
|---|---|---|---|
| 3,563,817 | 2/1971 | Chang et al. ........................ | 437/143 |
| 3,629,011 | 12/1971 | Tohi et al. . | |
| 3,829,333 | 8/1974 | Tohi et al. . | |
| 4,789,644 | 12/1988 | Meda .................................... | 437/41 |
| 5,030,580 | 7/1991 | Furukawa et al. .................... | 437/22 |
| 5,087,576 | 2/1992 | Edmond et al. ..................... | 437/22 |
| 5,270,244 | 12/1993 | Baliga ................................. | 437/67 |
| 5,286,660 | 2/1994 | Chiou et al. ........................ | 437/24 |
| 5,322,802 | 6/1994 | Baliga et al. ....................... | 437/22 |
| 5,364,810 | 11/1994 | Kosa et al. ......................... | 437/52 |
| 5,459,089 | 10/1995 | Baliga ................................. | 137/40 |

FOREIGN PATENT DOCUMENTS 47-18563  5/1972  Japan ................................... 437/22

OTHER PUBLICATIONS

Ahmed et al., Boron and Aluminum Implantation in αSiC, Appl. Phys. Lett 65(1), pp. 67–69, Jul. 1994.

Kalinina et al., Structure and Properties of Ion–Implantation–doped p–n Junctions in Sic, Sov. Phys. Semicond. 14(6), pp. 652–654, Jun. 1980.

Vodakov et al., Electrical properties of a p–n–n+ Structure Formed in Silicon Carbide by Implantation of Aluminum Ions, Sov. Phys. Semicond. 21(9), pp. 1017–1020, Sep. 1987.

Rao et al., Al and B Ion–Implantations in 6H– and 3C–SiC, J. Appl. Phys. 77(6), pp. 2479–2485, Mar. 1995.

Primary Examiner—John F. Niebling
Assistant Examiner—Richard A. Booth
Attorney, Agent, or Firm—Pollock, Vande Sande & Priddy

[57] ABSTRACT

A method for introduction of an impurity dopant into a semiconductor layer of SiC comprises the step of ion implantation of the dopant in the semiconductor layer at a low temperature. The ion implantation is carried out in such a way that a doped and amorphous near-surface layer is formed, and the implantation step is followed by a step of annealing the semiconductor layer at such a high temperature that the dopant diffuses into the non-implanted sublayer of the semiconductor layer following the near-surface layer.

12 Claims, 1 Drawing Sheet

METHOD FOR INTRODUCTION OF AN IMPURITY DOPANT IN SIC, A SEMICONDUCTOR DEVICE FORMED BY THE METHOD AND A USE OF HIGHLY DOPED AMORPHOUS LAYER AS A SOURCE FOR DOPANT DIFFUSION INTO SIC

OF THE INVENTION AND PRIOR ART

The present invention relates to a method for introduction of an impurity dopant into a semiconductor layer of SiC, comprising the step of ion implantation of the dopant in the semiconductor layer at a low temperature as well as a semiconductor device produced by carrying out such a method.

BACKGROUND OF THE INVENTION

Such ion implantation technique may be used for production of all types of semiconductor devices, such as for example different types of diodes, transistors and thyristors, and it is an attractive technique in device fabrication as it allows room temperature control of both impurity level and distribution. This technique is well developed for Si-devices, but the method successfully used for ion implantation for such devices may not be utilized for SiC-devices, which are particularly used in applications in which it is possible to benefit from the superior properties of SiC in comparison with primarily Si, namely the capability of SiC to function well under extreme conditions. SiC has a high thermal stability due to a large bandgap energy, so that devices fabricated from the material are able to operate at high temperatures, namely up to 1000 K. Furthermore, it has a high thermal conductivity, so that SiC devices may be arranged at a high density. SiC also has a more than five times higher breakdown field than Si, so that it is well suited as a material in high power devices operating under conditions where high voltages may occur in the blocking state of a device.

Accordingly, it is highly desired to find means to control this technique of device fabrication also for SiC, so that doped high quality regions with a low defect density may be created in SiC by ion implantation.

U.S. Pat. No. 3,629,011 describes a method according to the introduction, in which ions are implanted in SiC at room temperature, and the implanted near surface layer is then annealed at a temperature between 1200° and 1600° C. for electrically activating the impurity atoms implanted. It has turned out that the crystaline quality of the near surface layer thus created is not as high as desired and achievable by using the ion implantation technique for fabricating devices of Si.

It has also been discussed to carry out the ion implantation at such a dose that an amorphous near surface layer is formed and then anneals this layer, which has been successful in the technique of device fabrication in Si, since the amorphous layer will, during the annealing, be subjected to a "solid phase-epitaxy" or an epitaxial regrowth of the layer resulting in a high quality recrystallized layer, but it has turned out that this technique would be useless for SiC, since the annealing of this amorphous layer will result in polycrystalline forms of silicon carbide or defective single crystals of silicon carbide.

SUMMARY OF THE INVENTION

The object of the present invention is to provide a method of the type mentioned in the introduction, which makes it possible to use the ion implantation technique for producing doped layers in SiC having a very low defect density.

This object is, in accordance with the invention obtained by carrying out the ion implantation step a) in such a way that a doped and amorphous near surface layer is formed, and after step a) by annealing the semiconductor layer at such a high temperature that the dopant diffuses into the non-implanted sub-layer of the semiconductor layer following the near surface layer.

The method according to this invention makes it possible to obtain pn-junctions and doped SiC layers of very high quality, wherein the active SiC layers are formed via dopant diffusion at the annealing stage into the deeper crystal regions which are not damaged by the ion beam. It is found that the creation of an amorphous near-surface layer by ion implantation in SiC is very useful for creating high quality layers and pn-junctions. The creation of an amorphous layer is actually the key to the advantages of the invention. It has appeared that ion implantation, well below a dose giving rise to an amorphous layer, results in a rather slow disorder annealing and in out-diffusion of the major part of the implanted dopant. In addition, point defects created by the implantation diffuse into the non-implanted region creating poor material quality even beyond the implanted region. On the other hand, if the near-surface layer is amorphized, the re-crystallization rapidly removes the implantation-induced defects within the amorphized layer due to the difference in re-growth mechainsm, and a considerable part of the implanted dopant is activated. The remaining defects tend to be in the form of clusters or extended defects which do not diffuse.

According to a preferred embodiment of the invention, the near surface layer is amorphized in the implantation step by ion implantation of the dopant at such a dose that the near surface layer becomes highly doped and amorphous. Due to this, a high conductivity layer will be obtained after the annealing at the surface, and the possibility of forming good quality ohmic contacts with low resistivity is provided. Furthermore, the highly doped near surface layer will act as a dopant reservoir or source for diffusion of dopants into the sub-layer while electrically activating them during the annealing step and it will enhance the rate of diffusion of dopant into the non-implanted sub-layer.

According to another preferred embodiment of the invention, the dopant is, in the implantation step, implanted at a concentration below the amorphization limit of SiC and the near surface layer is then amorphized by implanting an inert species. Such an inert species may be for example Ar, Si or C. Such a technique would be appropriate where low doping levels are required.

Two problems are simultaneously solved with the use of the controlled amorphization, obtaining a low device resistivity under a forward bias and a low leakage current and a high breakdown voltage under reverse bias.

The disorder with the re-crystallized layer cannot be removed alltogether and if a pn-junction is formed at the interface of the amorphized region with the substrate, we obtain a poor device quality, as obtained in U.S. Pat. No. 3,629,011.

According to a preferred embodiment of the invention the semiconductor layer of SiC is low-doped and of a first conductivity type and the dopant is of a second opposite conductivity type, and step b) is carried out so that a graded pn-junction is formed in the sub-layer outside the implanted near surface layer. By using this method, it will be possible to form a graded pn-junction well away from the region heavily damaged by the ion implantation, so that the quality of this junction will be excellent.

It has been found that if acceptor ions are implanted, an n-dopant concentration in the top layer of the semiconductor layer of SiC below $10^{18}$ cm$^{-3}$ makes it possible to form the pn-junction deeper in the crystal due to the greater diffusion of the implanted dopant during the damage annealing. This radically improves the quality of the pn-junction.

According to another preferred embodiment of the invention, boron ions are implanted in step a). It has turned out that boron may be very useful for creating high quality layers of P-type in SiC through ion implantation, since it has a high diffusivity in SiC and is easily activated through annealing.

According to a further preferred emobidment, Al ions are implanted. Although the diffusivity of Al is lower than B, it is sufficient using the described technique to form a remote pn-junction. The lower activation energy of Al makes it a preferred dopant.

According to a further preferred embodiment of the invention step a) is carried out in several sub-steps using different implantation energies so as to form a high concentration of the dopant at different depths and a volume with a considerable depth of the highly doped amorphous near surface layer. This technique may be used to create a dopant reservoir with a high amount of dopant elements for diffusing into the sub-layer to form a high quality doped layer there.

According to still a further embodiment of the invention, the semiconductor layer is annealed at a temperature above 1700° C., which results in a satisfactory diffusion of the dopant into the sub-layer.

The present invention also provides a semiconductor device having a semiconductor layer of SiC formed by carrying out any of the methods in the appended method claims. Such a semiconductor device will have a doped semiconductor layer with very high quality for the reasons set out above.

According to a preferred embodiment of the invention, the implanted and annealed near surface layer of such a device may be used for forming a contact, so that the nature of this regrown damaged surface as a good contact is utilized.

The invention also results in the use of a new type of source for dopant diffusion into a semiconductor layer of SiC, namely a highly doped and amorphous near surface layer of the semiconductor layer.

Such a source for dopant diffusion will enhance the rate of diffusion of the dopant and the dopant diffusion may be accurately controlled.

Further, preferred features and advantages of the invention will appear from the following description and the other dependent claims.

BRIEF DESCRIPTION OF THE DRAWING

With reference to the appended drawing, below follows a specific description of a preferred embodiment of the invention cited as an example.

In the drawings.

DETAILED DESCRIPTION OF A PREFERRED EMBODIMENT

Figure 1:
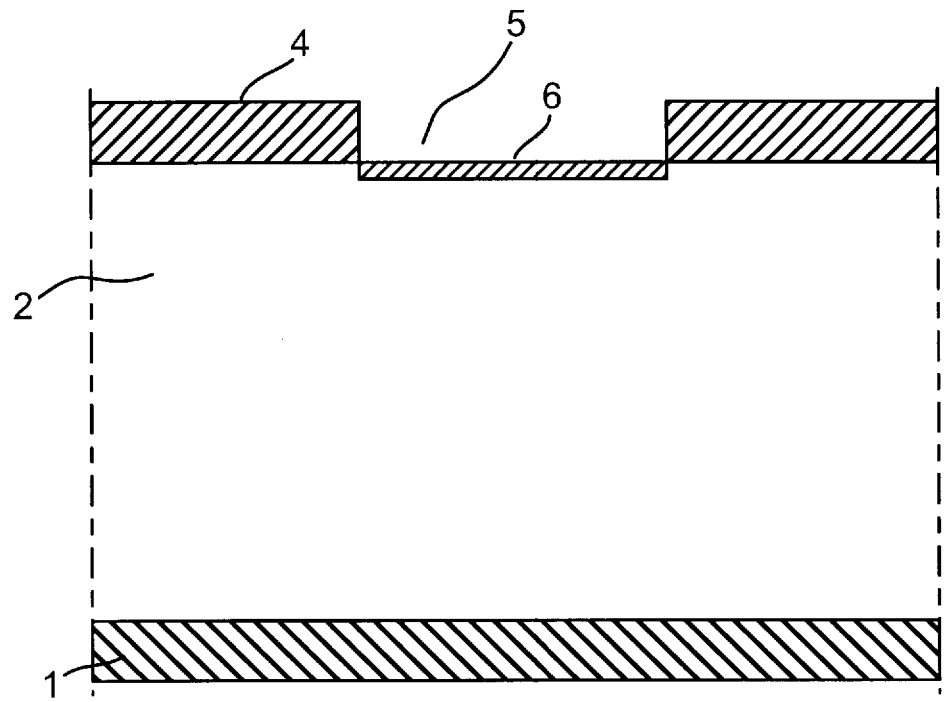
FIGS. 1 and 2 illustrate schematically different steps of a method for introduction of an impurity dopant into a semiconductor layer of SiC, and thereby creating a semiconductor power device in the form of a rectifier diode according to a preferred embodiment of the invention.
Figure 2:
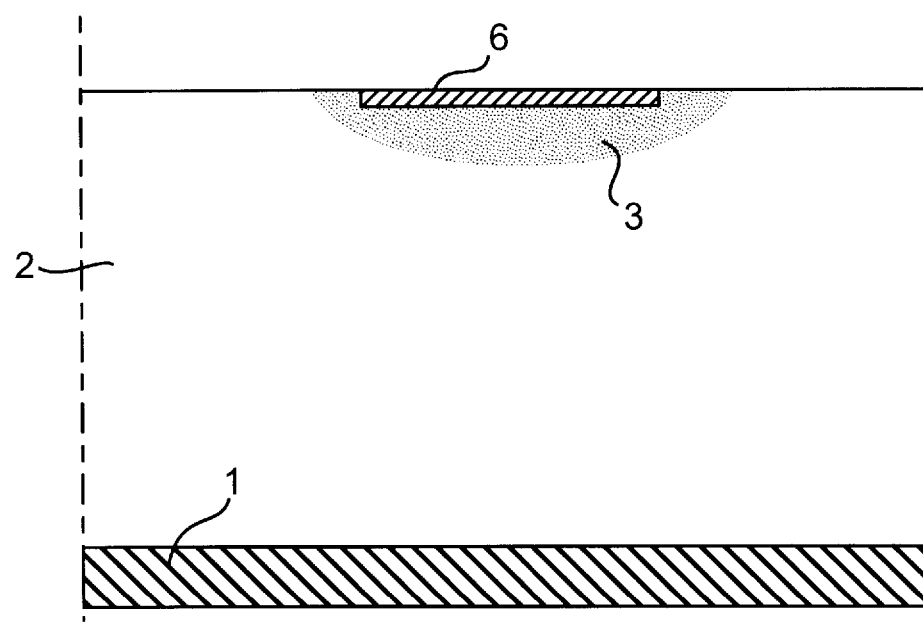

FIGS. 1 and 2 illustrate the two important major steps of a large number of steps of a method according to the invention for introduction of an impurity dopant into a semiconductor layer of SiC, which here is used for producing a power diode. All the layers of this device are made of SiC, but it is within the scope of the invention that the other semiconductor layers than that into which an impurity dopant is introduced by ion implantation are of another material than SiC. A device created in this way and schematically shown in FIG. 2 has three differently doped layers, namely a first highly doped layer 1, preferably forming the substrate, of N-type conductivity for making a low resistance contact with an ohmic contact metal plate of the device not shown in FIG. 2, a second low-doped N-type conductivity thicker layer 2 arranged thereon and a third thinner P-type conductivity layer 3 arranged in, and on, the top of the second layer 2 for forming a pn-junction at the interface therewith and which is created according to the method of the present invention. In a rectifier diode having these three layers the space charge region is primarily provided by the second low-doped layer 2, which will take the main part of the voltage applied on the device in the reverse operating direction thereof, and such a device may have a breakdown voltage in the kV-range.

The method according to the invention will now be explained while referring to FIGS. 1 and 2. The top of the SiC layer 2 is coated by a mask material 4, which has been etched to expose the SiC layer in a central region 5 thereof, where ions are to be implanted. The mask may preferably be made of AlN, which withstands the high temperatures in the annealing step of the process, but another masking material may also be used, however, that may necessitate the removal thereof before annealing.

After the removal of the mask material, preferably by reactive ion etching (RIE), ions are implanted by acceleration thereof into this central region 5 of the SiC layer 2. The ions are preferably aluminium or boron ions. Al is preferred due to its low ionization energy, where B has the advantage of higher diffusivity and good activation behavior. The energy used for the bombardement of the central region 5 by the ions is preferably in the range of 100 KeV–300 KeV.

The implantation is preferably carried out in the form of multiple implants in several sub-steps using different implantation energies to form a high concentration of the dopant at different depths and form a volume of a highly doped near surface layer 6 having a considerable depth. The implantation is carried out at a dose making the so formed near surface layer 6 amorphous, and a threshold for achieving this is a surface concentration of the dopant of approximately $10^{15}$ cm$^{-2}$. The implantation is preferably carried out at a dose creating a surface concentration of the dopant of substantially $10^{16}$ cm$^{-2}$ and a volume concentration in the near surface layer exceeding $10^{19}$ cm$^{-3}$, preferably exceeding $10^{20}$ cm$^{-3}$. The highly doped amorphous near-surface layer 6 created in this way may have a depth of approximately 0,25 μm. The implantation of the ions at these high doses resulting in an amorphous near surface layer will give rise to extended defects in the form of clusters in this layer.

The implantation is carried out at a low temperature, which means a temperature below 400 K, preferably at normal temperature, i.e. close to room temperature.

The implantation step may be followed by a step of removal of the mask material 4 by, for instance, RIE, or the mask may be removed after the following annealing step. Alternatively, if the mask is not degraded by the annealing it may be left to form part of the surface passivation of the device.

The annealing step is carried out at such a temperature, and for such a time, that the dopant implanted in the near surface region 6 is not only well activated but also diffuses so far into the non-implanted sub-layer of the semiconductor layer 2 following the near surface layer that the region of the sub-layer receiving the diffused dopant will form a graded pn-junction with the low-doped semiconducting layer 2 well away from the damaged near surface layer 6. This means, preferably, an annealing temperature of 1700° C.

The annealing results in an enhanced diffusion of the dopant into said non-implanted sub-layer, since the amorphous highly-doped layer 6 will act as a dopant reservoir which enhances the rate of diffusion due to the high concentration of the dopant therein. Furthermore, the defects in the near surface layer 6 in the form of clusters may not diffuse from the implanted layer, so that the third layer 3 so created will have a very high order with hardly any defects. The third layer 3 produced in this way is indicated in FIG. 2 by points. This layer may have a depth of approximately 0,5 μm. The doping profile in this diffused layer is expected to have a concentration of boron atoms of approximately $10^{18}$ cm$^{-3}$ close to the near surface layer 6 and $10^{16}$ cm$^{-3}$ mostly remote therefrom.

Furthermore, the annealing of the near surface layer 6 will result in a regrowth of this damaged layer, but the quality thereof will not be sufficient to work itself as a good pn-junction. However, this damaged surface may be a good contact, so that it may be used as a contact for the device produced by carrying out the method. It would also be possible to remove the near surface layer 6 by any suitable technique after the annealing.

The layers 1, 2, 3 and 6, as well as the mask 4, have been shown in proportions deviating from reality for the sake of clarity, and the thickness of the layers 1 and 2 may typically be in the range of about 5 μm and 25–40 μm or larger, respectively.

The invention is, of course, not in any way restricted to the preferred embodiment described above, but several possibilities to modifications thereof would be apparent to one of ordinary skill in the art without departing from the basic idea of the invention.

The method according to the invention is applicable to all types of introduction of an impurity dopant into a semiconductor layer of SiC, especially where a p-doped layer is required, not only to the formation of a pn-junction. The formation of contact layers may be mentioned as an example of an alternative application. The invention describes a technique appropriate to implantation of p-type dopants. Although n-type implantation may be achieved by similar means, this has a well established technique which does not require the method here described to achieve suitable device quality layers.

The definition "SiC layer" includes SiC layers comprising several sub-layers as shown in the drawings. Furthermore, the definition layer is to be interpreted broadly and comprises all types of volume extensions and shapes.

All definitions concerning the material of different layers of course also include inevitable impurities as well as intentional doping when SiC is concerned.

What is claimed is:

1. A method for introducing an impurity dopant into a semiconductor layer of SiC, said method comprising the steps of:

a) implanting dopant ions into said semiconductor layer at a concentration limit below the amorphization limit of SiC to from a doped near-surface layer; and then b) implanting inert species into said semiconductor layer such that said near surface layer of said semiconductor layer becomes doped and amorphous; and c) annealing said semiconductor layer at such a temperature that said dopant diffuses into a non-implanted sub-layer of said semiconductor layer below said near surface layer.

2. A method according to claim 1, wherein one of Ar, Si and C is implanted as said inert species.

3. A method according to claim 1, wherein the annealing is carried out at such a high temperature and for such a time length that said dopant diffuses so far into said sub-layer that the thickness of the region of said sub-layer receiving the diffused dopant exceeds the thickness of said implanted near-surface layer.

4. A method according to claim 1, wherein said semiconductor layer of SiC is doped and is of a first conductivity type and said dopant is of a second opposite conductivity type, and that step c) is carried out so that a graded pn-junction is formed in said sub-layer outside said implanted near-surface layer.

5. A method according to claim 4, wherein a dopant of P-type conductivity is implanted in step a).

6. A method according to claim 5, wherein boron ions are implanted in step a).

7. A method according to claim 5, wherein aluminum ions are implanted in step a).

8. A method according to claim 1, wherein step a) further comprises several sub-steps using different implantation energies so as to form a high concentration of the dopant at different depths, and so as to form a volume with a depth of said doped amorphous near-surface layer.

9. A method according to claim 1, wherein the implantation energy in step a) is selected to create a depth of said implanted near-surface layer above 0.1 um.

10. A method according to claim 1, wherein said semiconductor layer is kept at a temperature below 400° K. during said implantation.

11. A method according to claim 1, wherein said annealing is performed at a temperature above 1500° C.

12. A method according to claim 1, wherein said annealing is performed at a temperature above 1700° C.

* * * * *